United States Patent
Paul et al.

(10) Patent No.: US 11,592,507 B2
(45) Date of Patent: Feb. 28, 2023

(54) DETERMINING A SATURATION PULSE FOR SUPPRESSING SIGNALS FROM UNWANTED AREAS

(71) Applicant: Siemens Healthcare GmbH, Erlangen (DE)

(72) Inventors: Dominik Paul, Bubenreuth (DE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/485,805

(22) Filed: Sep. 27, 2021

(65) Prior Publication Data

US 2022/0099773 A1 Mar. 31, 2022

(30) Foreign Application Priority Data

Sep. 28, 2020 (DE) .......................... 102020212170.2

(51) Int. Cl.
*G01R 33/483* (2006.01)
(52) U.S. Cl.
CPC ..... *G01R 33/4838* (2013.01); *G01R 33/4835* (2013.01)
(58) Field of Classification Search
None
See application file for complete search history.

(56) References Cited

U.S. PATENT DOCUMENTS

| 2014/0081123 | A1* | 3/2014 | Korosec | A61B 5/055 600/413 |
| 2018/0074146 | A1 | 3/2018 | Bhat et al. | |
| 2018/0120401 | A1* | 5/2018 | Shin | G01R 33/4822 |

OTHER PUBLICATIONS

Del Grande Flippo et al.: "Fat-suppression techniques for 3-T MR imaging of the musculoskeletal system1." Radiographics, 2014, 34. Jg., Nr. 1, S. 217-233.
Barth, Markus et al. "Simultaneous Multislice (SMS) Imaging Techniques" Magnetic Resonance in Medicine, vol. 75, pp. 63-81, 2016 // DOI: 10.1002/mrm.25897.
Office Action dated Aug. 18, 2021 for German Patent Application No. 102020121170.2.

\* cited by examiner

*Primary Examiner* — Rodney E Fuller
(74) *Attorney, Agent, or Firm* — Banner & Witcoff Ltd.

(57) ABSTRACT

A method for determining a saturation pulse for suppressing signals from unwanted areas in the context of acquiring measurement data from a target volume of an object under examination by means of a magnetic resonance system, includes: loading the characteristics of the unwanted areas from which signals are to be suppressed; determining area saturation pulses for signal suppression in each of the unwanted areas; and determining a saturation pulse for signal suppression in all the unwanted areas on the basis of the area saturation pulses determined.

11 Claims, 5 Drawing Sheets

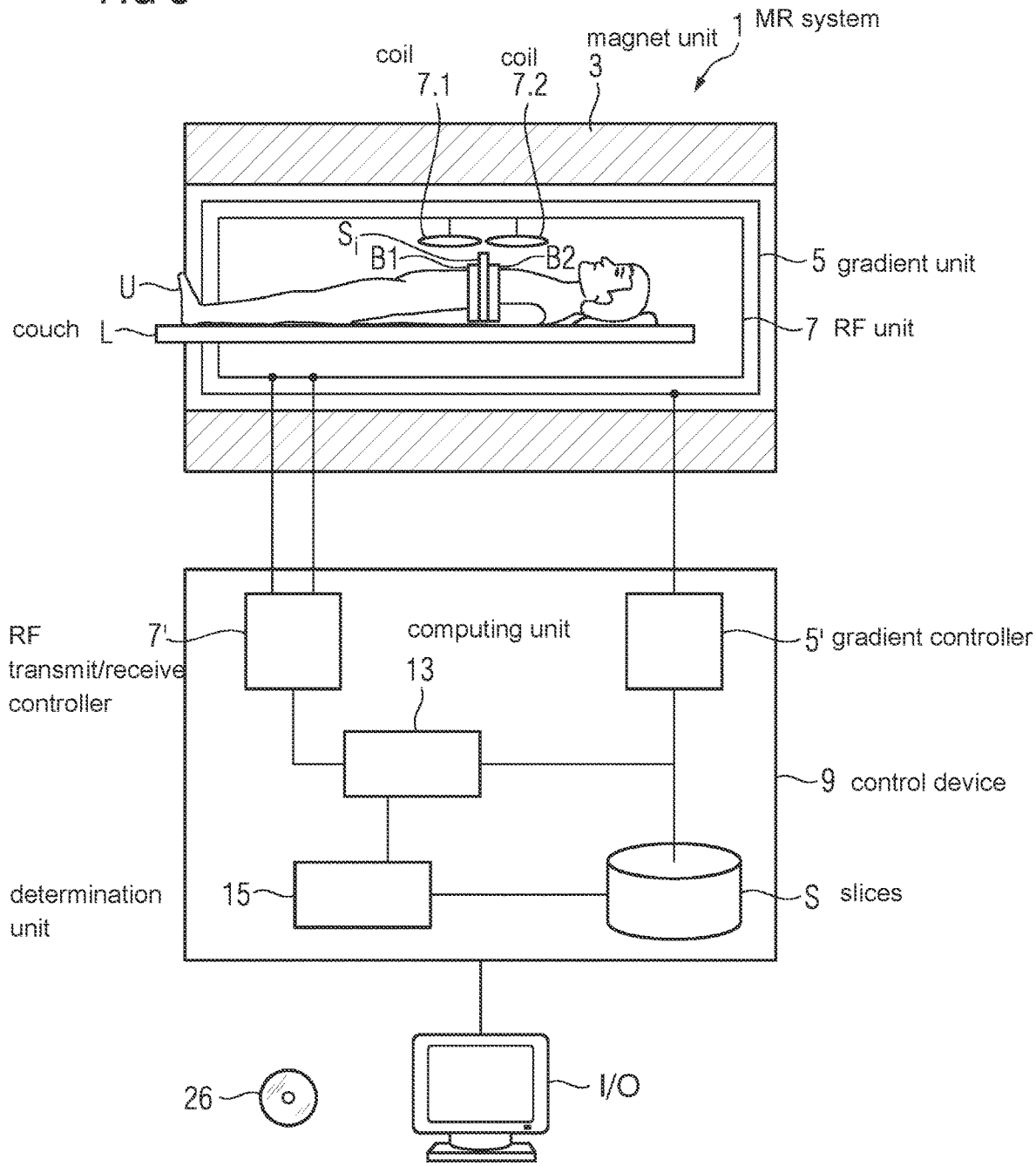

DETERMINING A SATURATION PULSE FOR SUPPRESSING SIGNALS FROM UNWANTED AREAS

TECHNICAL FIELD

The disclosure relates to a method for determining a saturation pulse for suppressing signals from unwanted areas in the context of acquiring measurement data from a target volume of an object under examination by means of a magnetic resonance system.

BACKGROUND

Magnetic resonance technology (hereinafter referred to as MR for short) is a known technique for generating images of the inside of an object under examination. In simple terms, the object under examination is positioned in a magnetic resonance device in a comparatively strong, static, homogeneous main magnetic field, also known as a $B_0$ field, with field strengths of 0.2 to 7 Tesla or more, so that its nuclear spins are oriented along the main magnetic field. To trigger nuclear spin resonances that can be measured as signals, radiofrequency excitation pulses (RF pulses) are applied to the object under examination, the nuclear spin resonances triggered are measured as so-called k-space data, and MR images are reconstructed or spectroscopy data is determined on the basis thereof. For spatial encoding of the measurement data, rapidly switched magnetic gradient fields, called gradients for short, are superimposed on the main magnetic field. A scheme used to describe a time sequence of RF pulses to be applied and gradients to be switched is called a pulse sequence (scheme), or sequence for short. The acquired measurement data is digitized and stored as complex numerical values in a k-space matrix. From the k-space matrix populated by values, an associated MR image can be reconstructed, e.g., by means of a multidimensional Fourier transform.

A known concept in magnetic resonance imaging are multi-slice images which can cover a large target volume by means of parallel slices. A direction is thus specified in which the target volume is subdivided one-dimensionally into a plurality of slices on the basis of slice thickness (slice selection direction).

It is also known to acquire target volumes as a whole. For example, if the spine is to be acquired as a target volume, use can be made of the knowledge can that two RF pulses of, e.g., a spin echo based sequence can be used to select slices not only in one dimension, but also parallelograms in two dimensions, by rotating the slice selection direction of an excitation pulse counter to that of a subsequent refocusing pulse, e.g., in the case of a spin echo sequence. The spin echo signal thus generated is derived from the intersection of the two rotated slices selected by the excitation pulse and refocusing pulse respectively. In this way, it is therefore possible, e.g., in the case of the spinal column, to acquire the target volume as a whole object, as opposed to multi-slice images where the individual slices ultimately constitute sub-volumes of the target volume.

In addition, signals from one or more areas of the object under examination can be suppressed during MRI scans, e.g., for signal suppression of areas located above and/or below a target volume of interest, in particular to avoid artifacts caused by substances flowing into or out of the target volume of interest, or also for signal suppression in edge areas of a slice to be acquired, e.g., in order to be able to limit the phase encoding to be applied. For this purpose, saturation pulses are applied to the object under examination which are designed to ensure that no signals or only small signals are generated from the unwanted areas during a time interval in which measurement data is being acquired from the target volume (e.g. pre-saturation). In this case, a saturation pulse is applied for each unwanted area before the desired measurement data is acquired. If there are a plurality of unwanted areas, a plurality of saturation pulses are therefore applied. However, this means that signals in an unwanted area initially saturated by means of a saturation pulse have more time to relax before acquisition of the desired measurement data than signals in another unwanted area saturated at a later time by means of a subsequent saturation pulse, as a result of which the saturation in the various unwanted areas may differ in intensity during acquisition of the desired measurement data. In addition, the number of saturation pulses to be successively applied for each unwanted area increases the preparation time required prior to acquiring desired measurement data, so that the minimum repetition time TR for acquiring the desired measurement data including the preparation by the saturation pulses increases, thereby increasing the overall scan time. This can also affect the contrast achievable for acquiring the desired measurement data.

SUMMARY

An object of the disclosure is to enable signals from a plurality of unwanted areas to be suppressed with minimal scan time and a degree of signal suppression that is as uniform as possible in the unwanted areas when acquiring desired measurement data from a target volume.

This object is achieved by a method for determining a saturation pulse for suppressing signals from unwanted areas in the context of acquiring measurement data from a target volume of an object under examination by means of a magnetic resonance system, a method for acquiring measurement data from a target volume of an object under examination by means of a magnetic resonance system while suppressing signals from unwanted areas, a magnetic resonance system, a computer program, and an electronically readable data carrier.

A method according to aspects of the disclosure for determining a saturation pulse for suppressing signals from unwanted areas in the context of acquiring measurement data from a target volume of an object under examination by means of a magnetic resonance system comprises the following steps:
  loading the characteristics of the unwanted areas from which signals are to be suppressed,
  determining area saturation pulses for signal suppression in each of the unwanted areas, and
  determining a saturation pulse for signal suppression in all the unwanted areas on the basis of the area saturation pulses determined.

The disclosed simultaneous suppression of signals from a plurality of unwanted areas improves the image quality of image data reconstructed from measurement data acquired after the saturation pulse according to aspects of the disclosure, as uniform saturation can be achieved in the unwanted areas, thereby preventing artifacts. In addition, a saturation pulse according to aspects of the disclosure only takes a short time compared to a plurality of saturation pulses to be applied successively, so that the total scan time including preparation by a saturation pulse according to aspects of the disclosure and acquisition of measurement data can also be kept short.

A method according to aspects of the disclosure for acquiring measurement data from a target volume of an object under examination by means of a magnetic resonance system while suppressing signals from unwanted areas uses saturation pulses described herein and thus comprises the steps:

In a preparation phase, applying a saturation pulse according to aspects of the disclosure in order to saturate signals from the unwanted areas, Starting acquisition of measurement data from the target volume at a point in time at the end of the preparation phase at which signals from the unwanted areas disappear due to the saturation pulse.

A magnetic resonance system according to aspects of the disclosure comprises a magnet unit, a gradient unit, a radiofrequency unit, and a control device designed to carry out a method according to aspects of the disclosure and incorporating a saturator determination unit.

A computer program according to aspects of the disclosure implements a method according to aspects of the disclosure on a control device when it is executed on the control device.

The computer program can also be in the form of a computer program product loadable directly into a memory of a control device and having program code means for carrying out a method according to aspects of the disclosure when the computer program product is run in the computing unit of the computing system.

An electronically readable data carrier according to aspects of the disclosure comprises electronically readable control information stored thereon, which comprises at least one computer program according to aspects of the disclosure and is designed to carry out a method according to aspects of the disclosure when the data carrier is used in a control unit of a magnetic resonance system.

The advantages and embodiments disclosed with respect to the method for determining a saturation pulse apply analogously to the method for acquiring measurement data, the magnetic resonance system, the computer program product, and the electronically readable data carrier.

BRIEF DESCRIPTION OF THE DRAWINGS

Further advantages and details of the present disclosure will emerge from the exemplary embodiments described below and the accompanying drawings. The examples given do not constitute a limitation of the disclosure.

FIG. 5 schematically illustrates a magnetic resonance system according to aspects of the disclosure.

DETAILED DESCRIPTION

Figure 1:
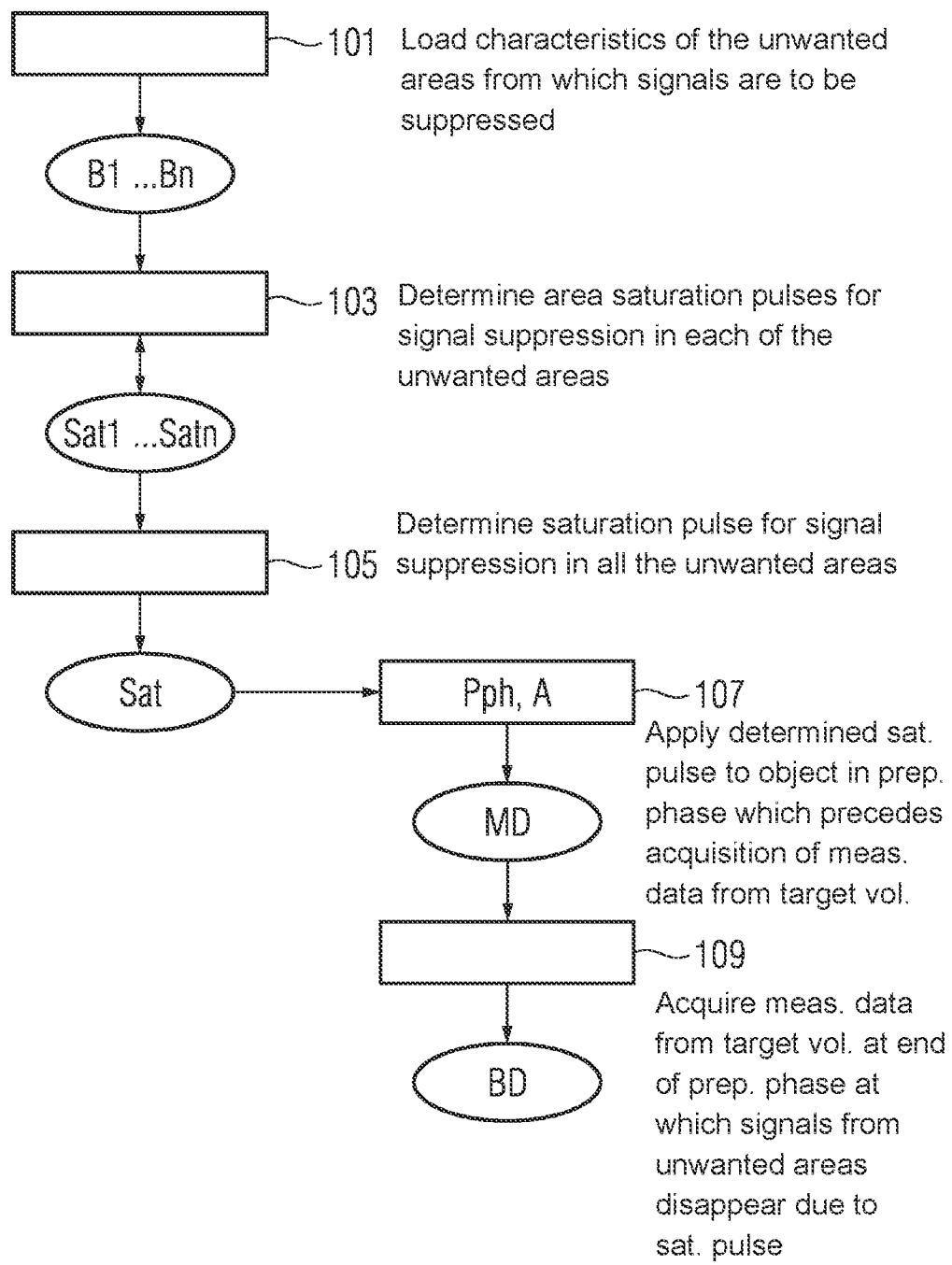
FIG. 1 shows a schematic flow chart of a method according to aspects of the disclosure.

FIG. 1 is a schematic flow chart of a method according to aspects of the disclosure for determining a saturation pulse for the suppression of signals from unwanted areas in conjunction with a method for acquiring measurement data from a target volume of an object under examination by means of a magnetic resonance system whereby signals from unwanted areas are suppressed.

To determine a saturation pulse for suppressing signals from unwanted areas in the context of acquiring measurement data from a target volume of an object under examination by means of a magnetic resonance system, characteristics of the unwanted areas B1 ... Bn from which signals are to be suppressed are loaded (block 101). The characteristics determine, e.g., the position, orientation and extent of the unwanted areas B1 ... Bn and, if necessary, also which type of signals are to be suppressed in the unwanted areas B1 ... Bn. The number n of loaded unwanted areas B1 ... Bn is at least n=2. An unwanted area B1 ... Bn can in particular be a slice whose slice thickness corresponds to the extent of the unwanted area B1 ... Bn.

On the basis of the characteristics, area saturation pulses Sat1 ... Satn are determined for signal suppression in each of the unwanted areas (block 103).

Figure 2:
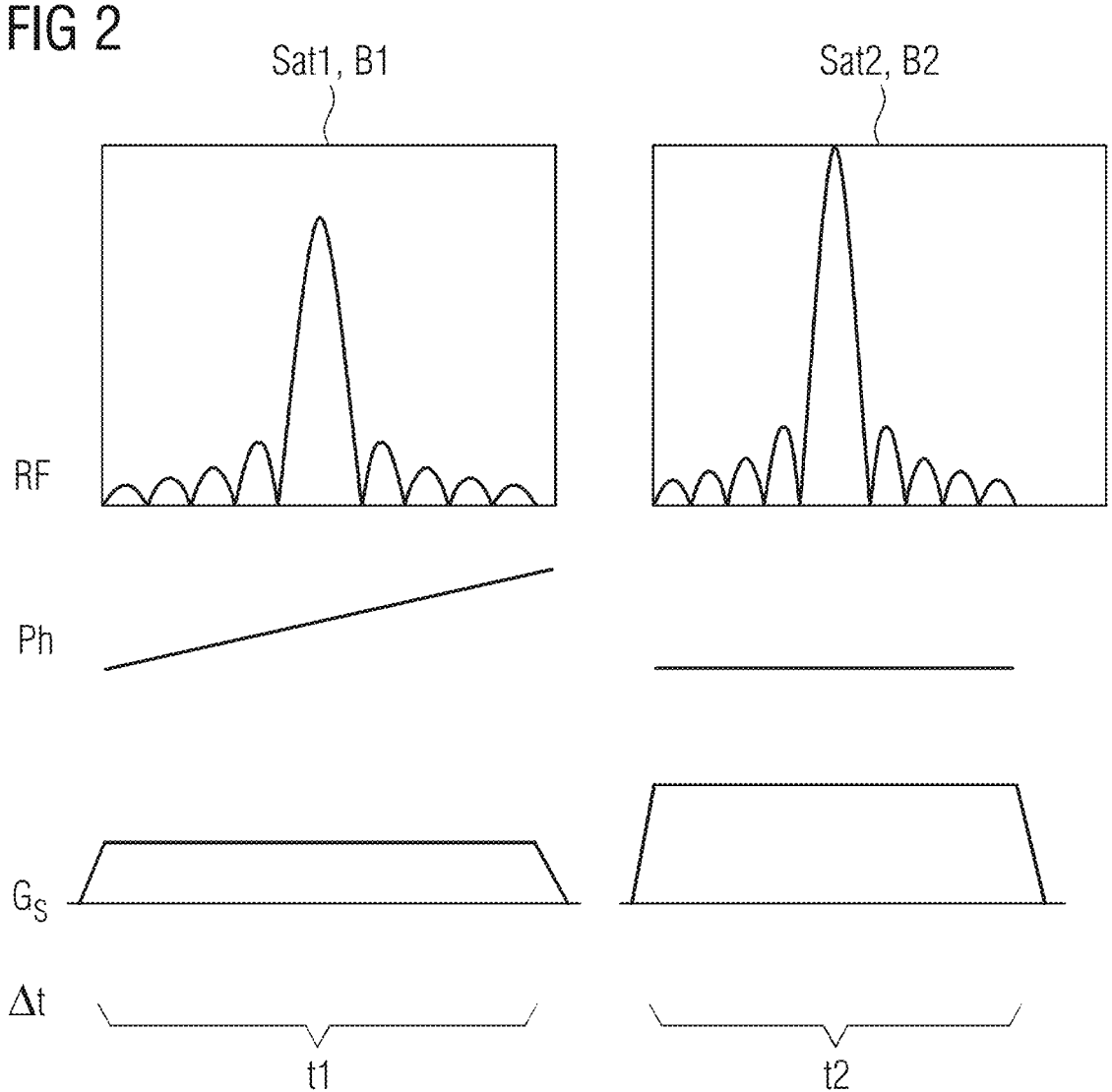
FIG. 2 schematically illustrates two area saturation pulses for different unwanted areas with example parameters.

FIG. 2 shows an example of two area saturation pulses Sat1 and Sat2 (here n=2) for different unwanted areas B1 and B2 with example parameters.

For each area saturation pulse Sat1 and Sat2, the top row "RF" shows a respective pulse shape and a respective amplitude response, the row "Ph" shows a respective phase, the row "$G_s$" shows a respective slice selection gradient to be applied simultaneously with the associated area saturation pulse Sat1, Sat2, and the row "$\Delta t$" shows the respective duration, here t1, t2, of the area saturation pulses Sat1, Sat2 illustrated, which is inversely proportional to the bandwidth covered by the respective area saturation pulse Sat1, Sat2. Due to the different characteristics of the various unwanted areas B1 ... Bn, in particular the respective position and/or extent thereof, the area saturation pulses Sat1 ... Satn determined in each case for an unwanted area B1 ... Bn can have different values in their parameters, in particular in the slice selection gradients $G_s$ to be switched and/or in the frequencies defined by the pulse shape, or also in the linear phases Ph. If the unwanted areas B1 and B2 lie parallel to one another in this case, the respective slice selection gradients $G_s$ can be switched in the same direction.

For determining the saturation pulse Sat, the area saturation pulses Sat1 ... Satn determined can be aligned to one another, e.g., to ensure their compatibility and/or to optimize them with respect to one of their parameters and/or to ensure their feasibility for the magnetic resonance system.

Thus, aligning of saturation pulses Sat1 ... Satn can in particular include harmonizing at least one of the parameters comprising the duration $\Delta t$, the bandwidth and the phase of the area saturation pulses Sat1 ... Satn as well as a slice selection gradient $G_s$ to be switched simultaneously with an area saturation pulse Sat1 ... Satn.

When determining the area saturation pulses, a first area saturation pulse Sat1 can initially be determined for one of the unwanted areas B1, and the other area saturation pulses Sat2 ... Satn for the other unwanted areas Sat2 ... Satn can be determined as a function of the first area saturation pulse Sat1. This ensures that, e.g., the same slice selection gradient $G_s$ can be used for all the area saturation pulses Sat1 ... Satn and/or the duration of the saturation pulse Sat to be determined can be limited to a desired maximum duration by skillful selection of the first area saturation pulse Sat1 on the basis of which the other area saturation pulses Sat2 ... Satn are determined.

The first area saturation pulse Sat1 on the basis of which the other area saturation pulses Sat2 ... Satn are determined can be selected such that it saturates the unwanted area B1 of the unwanted areas B1 ... Bn that has the smallest extent of all the unwanted areas B1 . . . Bn. As a result, the first area saturation pulse Sat1 selected is an area saturation pulse which has a small, possibly the smallest, bandwidth of all the area saturation pulses B1 . . . Bn, and thus a long, possibly the longest, duration Δt of all the area saturation pulses Sat1 . . . Satn, which can then be used as the shortest possible duration of the saturation pulse Sat to be determined.

For example, based on a slice selection gradient $G_s$ determined for the first area saturation pulse Sat1, the area saturation pulses Sat2 . . . Satn for the respective saturations of the unwanted areas B2 . . . Bn can be adapted in respect of their bandwidth, e.g., by appropriate lengthening of their duration Δt, in order to obtain the respective extent with the same slice selection gradient $G_s$. By increasing the duration Δt of an area saturation pulse Sat2 . . . Satn, the amplitude of that area saturation pulse can be simultaneously reduced to achieve the same flip angle. Therefore, the load placed on the RF unit generating the RF pulses to be applied can also be reduced.

A saturation pulse Sat for signal suppression in all the unwanted areas B1 . . . Bn is determined (block 105) on the basis of the determined area saturation pulses Sat1 . . . Satn.

Determination of the saturation pulse Sat can consist of an addition, in particular addition in the time domain of the determined area saturation pulses Sat1 . . . Satn.

When determining the saturation pulse Sat on the basis of the determined area saturation pulses Sat1 . . . Satn, the time centers of the determined area saturation pulses Sat1 . . . Satn, in particular for an above-mentioned addition, can be selected such that they coincide in time. In this way, the area saturation pulses Sat1 . . . Satn have an optimally simultaneous effect in the particular saturation pulse Sat.

An illustrative example of this will be described with reference to FIG. 3 which schematically illustrates the formation of a saturation pulse Sat according to aspects of the disclosure for different unwanted areas B1, B2.

Figure 3:
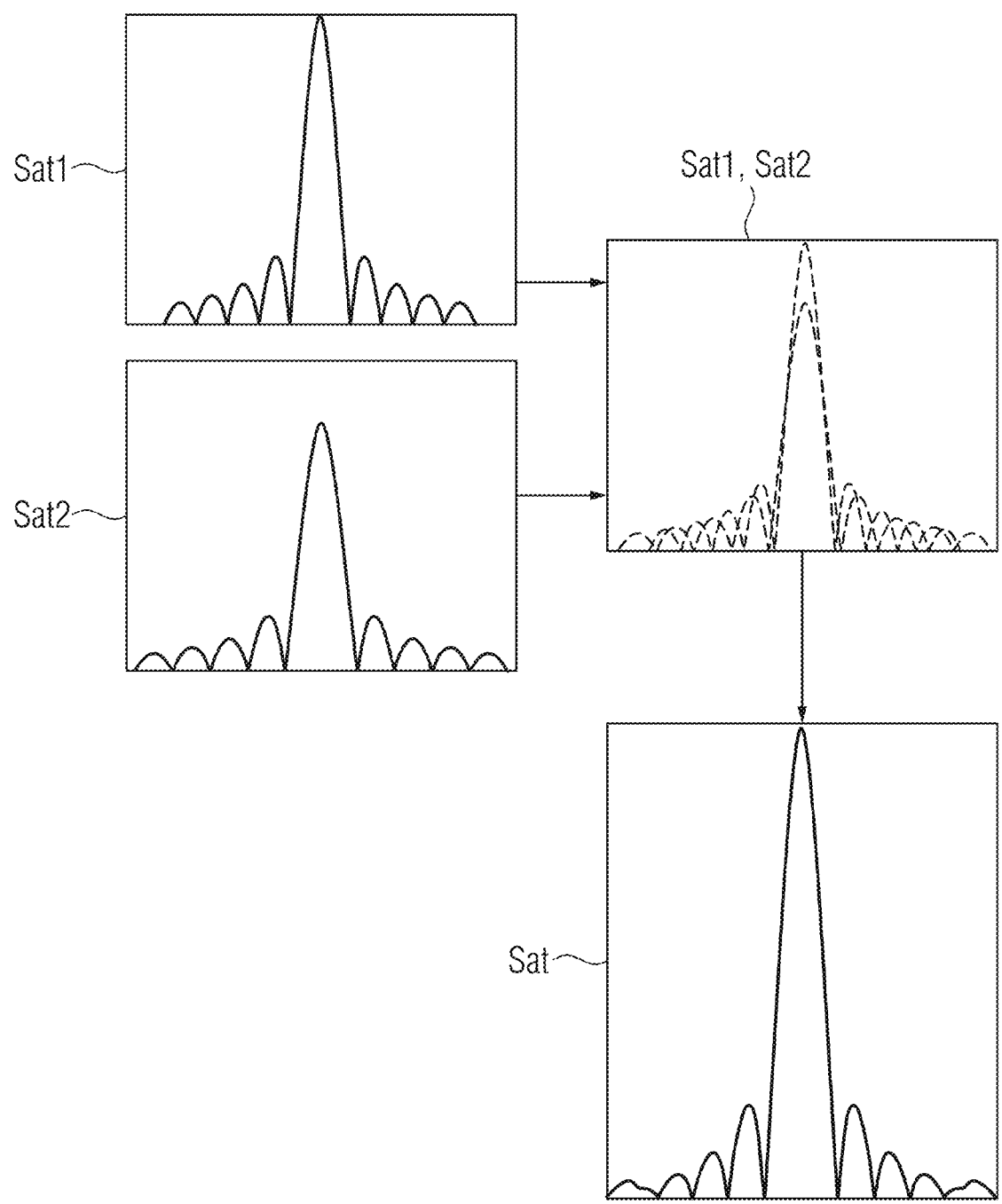
FIG. 3 schematically illustrates the formation of a saturation pulse according to aspects of the disclosure for different unwanted areas.

In FIG. 3, two area saturation pulses Sat1 and Sat2, each saturating an unwanted area B1 and B2 respectively, are shown on the left in their pulse shapes over time. Although the depicted area saturation pulses Sat1 and Sat2 have different durations, they have been arranged such that their centers are present at the same time. This can be clearly seen at top right in FIG. 3, where the area saturation pulses Sat1, Sat2 are shown superimposed. By adding the two area saturation pulses Sat1 and Sat2 in the time domain shown, a saturation pulse Sat can be determined which saturates both unwanted areas B1 and B2.

A saturation pulse Sat determined in this way for saturating signals from the unwanted areas B1 . . . Bn can be applied to the object under examination in a preparation phase Pph which precedes acquisition A of measurement data MD from a target volume under examination (block 107).

Figure 4:
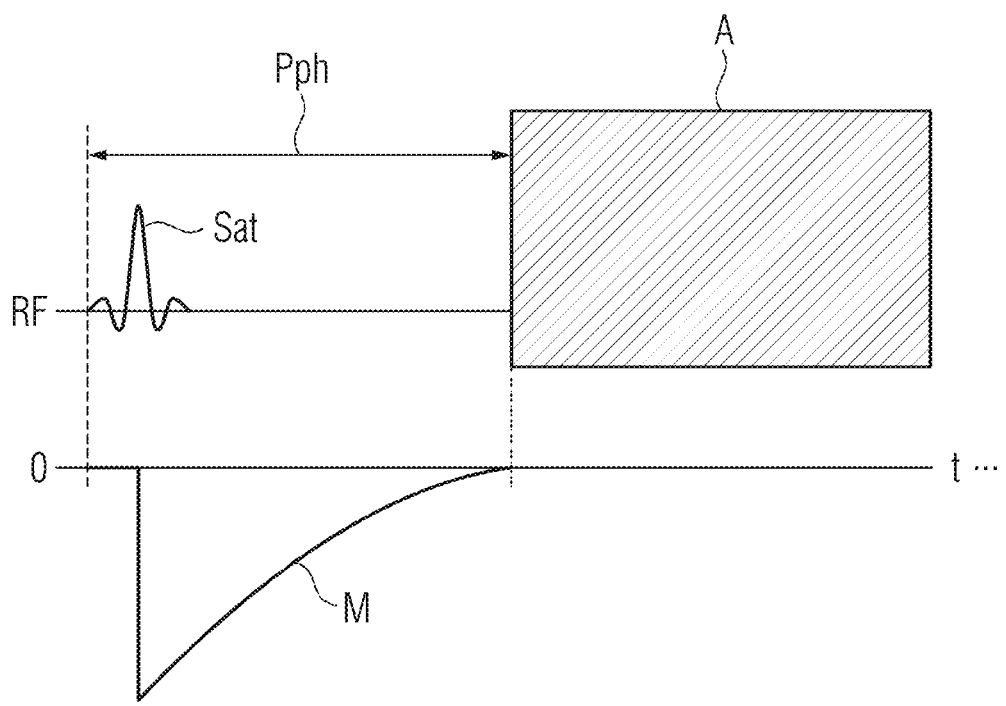
FIG. 4 schematically illustrates a preparation phase for suppressing signals from unwanted areas with subsequent acquisition of measurement data.

Such a procedure is illustrated in FIG. 4 which shows a schematic representation of a preparation phase Pph for the suppression of signals from unwanted areas with subsequent acquisition of measurement data.

At the beginning of a preparation phase Pph, a radiofrequency (RF) saturation pulse Sat, e.g., determined as described above, is generated by means of a radiofrequency unit and applied to an object under examination. The saturation pulse Sat generates a magnetization M of the spins in the unwanted areas, the signal of which is to be suppressed in the subsequent acquisition A of measurement data. In the course of the preparation phase Pph, the magnetization M generated by the saturation pulse Sat decays until it reaches the value zero, and has therefore decayed completely. Once the magnetization M has completely decayed, the preparation phase Pph can terminate and acquisition A of measurement data can take place using a conventional magnetic resonance technique. In other words, acquisition A of measurement data MD from the target volume $S_i$ can be started at the end of the preparation phase Pph at a point in time when signals from the unwanted areas disappear as a result of the saturation pulse.

FIG. 5 schematically illustrates a magnetic resonance system 1 according to aspects of the disclosure. This comprises a magnet unit 3 for generating the main magnetic field, a gradient unit 5 for generating the gradient fields, a radiofrequency unit 7 for emitting and receiving radiofrequency signals, and a control device 9 designed to carry out a method according to aspects of the disclosure.

In FIG. 5, these sub-units of the magnetic resonance system 1 are shown only in grossly schematic form. In particular, the radiofrequency unit 7 may comprise a plurality of sub-units, e.g., a plurality of coils such as the schematically shown coils 7.1 and 7.2, or more coils, which can be designed either only for transmitting radiofrequency signals or only for receiving the triggered radiofrequency signals, or for both.

For scanning an object under examination U, e.g., a patient or also a phantom, the object can be moved on a couch L into the magnetic resonance system 1 in the measuring volume thereof. The slice or slab $S_i$ represents an exemplary target volume of the object under examination from which data is to be acquired and collected as measurement data. Examples of unwanted areas B1 and B2 disposed parallel to the target volume $S_i$ are indicated, with the unwanted area B2 having a smaller extent than the unwanted area B1.

The control device 9 is used to control the magnetic resonance system 1 and, in particular, can control the gradient unit 5 by means of a gradient controller 5' and the radiofrequency unit 7 by means of a radiofrequency transmit/receive controller 7'. The radiofrequency unit 7 can here comprise a plurality of channels on which signals can be transmitted or received.

The radiofrequency unit 7, together with its radiofrequency transmit/receive controller 7', is used to generate and apply (transmit) a radiofrequency alternating field for manipulating the spins in an area to be manipulated (e.g. in slices S to be measured) of the object under examination U. In this process, the center frequency of the radiofrequency alternating field, also termed the B1 field, is generally set as close as possible to the resonant frequency of the spins to be manipulated. Deviations of the center frequency from the resonance frequency are termed off-resonance. To generate the B1 field, controlled currents are applied to the RF coils in the RF unit 7 by means of the RF transmit/receive controller 7'.

In addition, the control device 9 comprises a saturator determination unit 15 which can be used to determine saturation pulses according to aspects of the disclosure for suppressing signals from unwanted areas, which can be implemented by the gradient controller 5' and the radiofrequency transmit/receive controller 7'. The control device 9 as a whole is designed to carry out a method according to aspects of the disclosure.

A computing unit 13 incorporated in the control device 9 is designed to perform all the computing operations necessary for the required measurements and determinations. Intermediate results and results required for this purpose or determined in the process can be stored in a memory unit S of the control device 9. The units shown here are not necessarily to be understood as physically separate units, but merely represent a subdivision into notional units, which can also be implemented, for example, in fewer or also in only one physical unit.

Via an input/output device I/O of the magnetic resonance system 1, control commands can be fed to the magnetic resonance system, e.g., by a user, and/or results of the control device 9, such as image data, can be displayed.

A method described here can also be in the form of a computer program product which comprises a program and implements the described method on a control device 9 when it is executed on the control device 9. An electronically readable data carrier 26 having electronically readable control information stored thereon can also be present which comprises at least one such computer program product as described and is designed to carry out the described method when the data carrier 26 is used in a control device 9 of a magnetic resonance system 1.

The invention claimed is:

1. A method for determining a saturation pulse for suppressing signals from unwanted areas in the context of acquisition of measurement data from a target volume of an object under examination by means of a magnetic resonance system, the method comprises:
    loading characteristics of the unwanted areas from which signals are to be suppressed;
    determining area saturation pulses for signal suppression in each of the unwanted areas; and
    determining a saturation pulse for signal suppression in all the unwanted areas on the basis of the area saturation pulses.

2. The method of claim 1, wherein the unwanted areas are parallel to one another.

3. The method of claim 1, wherein, for determining the saturation pulses, the area saturation pulses are aligned with one another.

4. The method of claim 3, wherein an aligning of the area saturation pulses includes aligning at least one of the parameters comprising the duration, the bandwidth, and the phase of the area saturation pulses and a slice selection gradient to be switched simultaneously with at least one of the area saturation pulses.

5. The method of claim 1, wherein, during the determination of the area saturation pulses, a first area saturation pulse is initially determined for one of the unwanted areas, and the other area saturation pulses for the other unwanted areas are determined as a function of the first area saturation pulse.

6. The method of claim 5, wherein the first area saturation pulse saturates an unwanted area of the unwanted areas that has the smallest extent among the unwanted areas.

7. The method of claim 1, wherein the determination of the saturation pulse includes addition in the time domain of the area saturation pulses determined.

8. The method of claim 1, wherein, for the determination of the saturation pulse on the basis of the area saturation pulses, the time centers of the area saturation pulses are selected such that they coincide in time.

9. A method for acquiring measurement data from a target volume ($S_i$) of an object under examination by means of a magnetic resonance system while suppressing signals from unwanted areas, the method comprising:
    in a preparation phase, applying a saturation pulse of claim 1 to saturate signals from the unwanted areas; and
    starting acquisition of measurement data from the target volume at a point in time at the end of the preparation phase at which signals from the unwanted areas disappear due to the saturation pulse.

10. A magnetic resonance system comprising a magnet unit, a gradient unit, a radiofrequency unit, and a controller having a radiofrequency transmit/receive controller and a saturator determination unit, wherein the controller is designed to carry out the method of claim 1 on the magnetic resonance system.

11. A non-transitory electronically readable data carrier having electronically readable control information stored thereon, comprising at least one computer program designed to carry out the method of claim 1 when the data carrier is used in a control device of a magnetic resonance system.

* * * * *